United States Patent
Hu

(10) Patent No.: US 10,068,838 B2
(45) Date of Patent: Sep. 4, 2018

(54) GLASS FIBER REINFORCED PACKAGE SUBSTRATE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/336,851

(22) Filed: Oct. 28, 2016

(65) Prior Publication Data

US 2018/0122736 A1    May 3, 2018

(51) Int. Cl.
    *H05K 1/09*        (2006.01)
    *H01L 23/498*      (2006.01)
    *H01L 21/48*       (2006.01)
    *H01L 21/683*      (2006.01)

(52) U.S. Cl.
    CPC ...... *H01L 23/49838* (2013.01); *H01L 21/486* (2013.01); *H01L 21/4853* (2013.01); *H01L 21/4857* (2013.01); *H01L 21/6835* (2013.01); *H01L 23/49816* (2013.01); *H01L 23/49822* (2013.01); *H01L 23/49827* (2013.01); *H01L 23/49894* (2013.01); *H01L 2221/68345* (2013.01); *H01L 2221/68359* (2013.01)

(58) Field of Classification Search
    CPC .......... H01L 23/49838; H01L 21/4853; H01L 21/4857; H01L 21/486; H01L 21/6835
    USPC ................ 174/251, 250, 255–258, 261, 262
    See application file for complete search history.

(56) References Cited

U.S. PATENT DOCUMENTS

| 9,263,373 B2 | 2/2016 | Hu | |
|---|---|---|---|
| 2013/0062777 A1* | 3/2013 | Ogata | H01L 24/05 257/774 |
| 2014/0078703 A1* | 3/2014 | Kim | H01L 23/5389 361/761 |

* cited by examiner

Primary Examiner — Tremesha S Willis
(74) Attorney, Agent, or Firm — JCIPRNET

(57) ABSTRACT

A glass fiber layer is embedded in a thin film package substrate to reinforce the strength of the thin film package substrate. The thin film package substrate has a bottom redistribution circuitry and a top redistribution circuitry. The glass fiber layer is configured between the bottom redistribution layer and the top redistribution layer. A topmost metal pads of the bottom redistribution layer and a bottommost metal vias of the top redistribution layer are embedded in the glass fiber layer.

10 Claims, 5 Drawing Sheets

GLASS FIBER REINFORCED PACKAGE SUBSTRATE

BACKGROUND

Technical Field

The present invention relates to a package substrate; especially relates to a package substrate having a glass fiber layer embedded therein.

Description of Related Art

FIG. 1 shows a prior art U.S. Pat. No. 9,263,373.

FIG. 1 shows a prior art. U.S. Pat. No. 9,263,373 disclosed a package substrate comprises a first redistribution layer RDL1, a second redistribution layer RDL2, and a third redistribution layer RDL3. Since the high density film is very thin roughly 50-200 um in total thickness, in order to enhance the stiffness or mechanical strength of the high density film for easy handling, fiber-based filler 55 can be embedded in one of the dielectric layer or molding compound to reinforce the strength of the high density film according to the present invention. The first redistribution layer RDL1 has a plurality of bottom metal pads B01 and a plurality of top metal pads B02. The third redistribution layer RDL3 has a plurality of bottom metal pads T01 and a plurality of top metal pads T02. The fiber-based filler 55 is embedded in the third redistribution layer TDL3. The top side of the package substrate is PCB side, and a bottom side of the package substrate is a chip side. A nanochip 60 is configured on bottom side of the package substrate.

The prior art did not disclose detailed relationship and structure for the fiber-based filler 55 within the third redistribution layer RDL3. A more feasible embodiment needs to be made so that the thin film package substrate can be easily handled for chip or chips to mount thereon.

DETAILED DESCRIPTION OF THE INVENTION

A glass fiber layer is embedded in a thin film package substrate to reinforce the strength of the thin film package substrate. The glass fiber layer is configured between a bottom redistribution layer and a top redistribution layer. A fabrication process for the glass fiber reinforced package substrate according the present invention is described as follows:

FIGS. 2A~2H show a fabrication process for a glass fiber reinforced package substrate according to the present invention.

Figure 1:
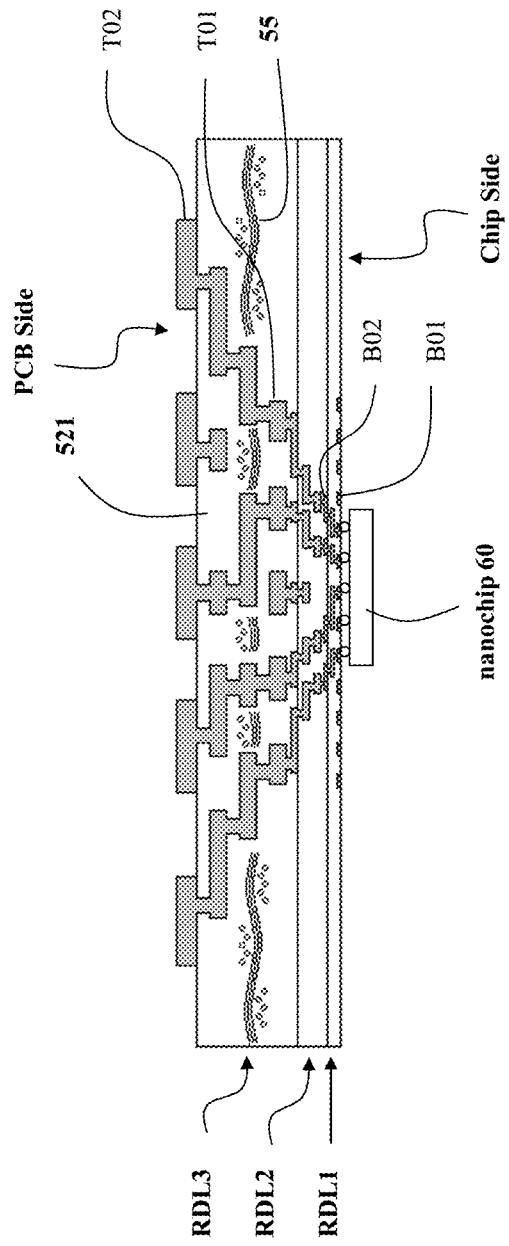
FIG. 1 shows a prior art U.S. Pat. No. 9,263,373.
Figure 2A:
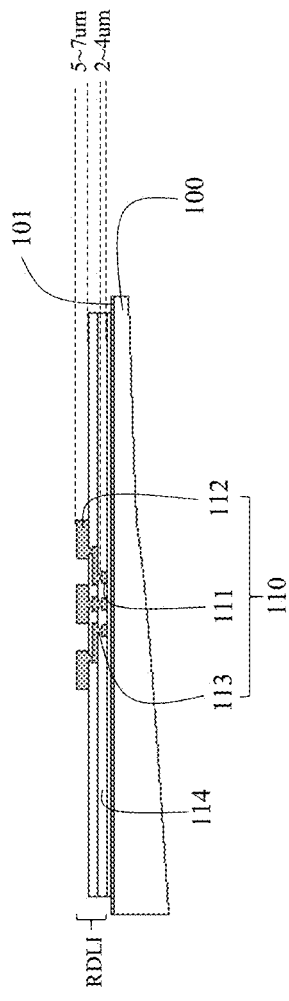
FIGS. 2A~2H show a fabrication process for a glass fiber reinforced package substrate according to the present invention.

A fabrication process for a glass fiber reinforced package substrate, comprising:

FIG. 2A shows: forming a release layer 101 on a top side of a temporary carrier 100, and forming a first redistribution circuitry 110 on a top side of the release layer 101. The first redistribution layer RDLI comprises a first redistribution circuitry 110 and a first dielectric layer 114. The first redistribution circuitry 110 is embedded in the first dielectric layer 114. A plurality of first bottom metal pads 111 is configured on a bottom side of the first redistribution circuitry 110; and a plurality of first top metal pads 112 is configured on a top side of the first redistribution circuitry 110. A plurality of first metal vias 113 is electrically coupled neighboring metal layers 111, 112 within the first redistribution circuitry 110 in thickness direction.

The first top metal pads 112 has a thickness, for example 5~7 um, greater than a thickness, for example 2~4 um, of the other metal layer or layers 111 within the first redistribution circuitry 110.

Figure 2B:
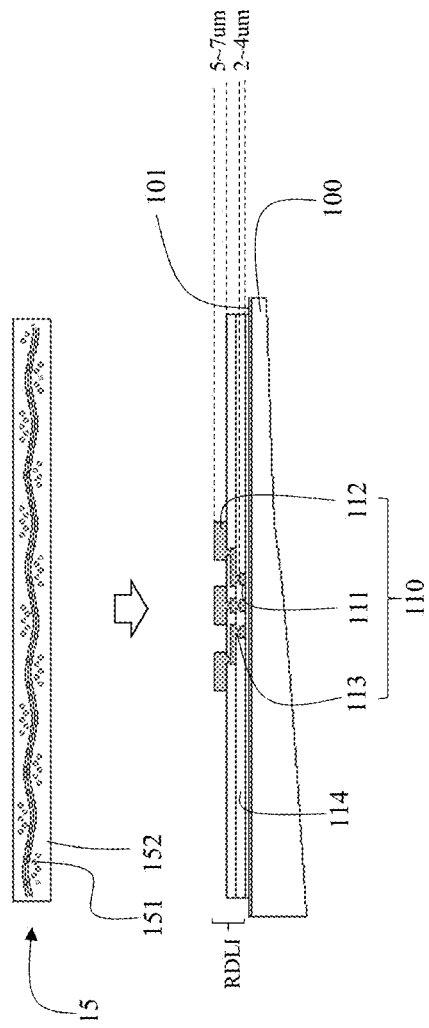

FIG. 2B shows: preparing a glass fiber layer 15, and waiting to laminate the glass fiber layer 15 onto a top side of the first redistribution circuitry 110. The glass fiber layer 15 comprises a plurality of glass fibers 151 and a dielectric layer 152. The glass fibers 151 is embedded in the dielectric layer 152.

Figure 2C:
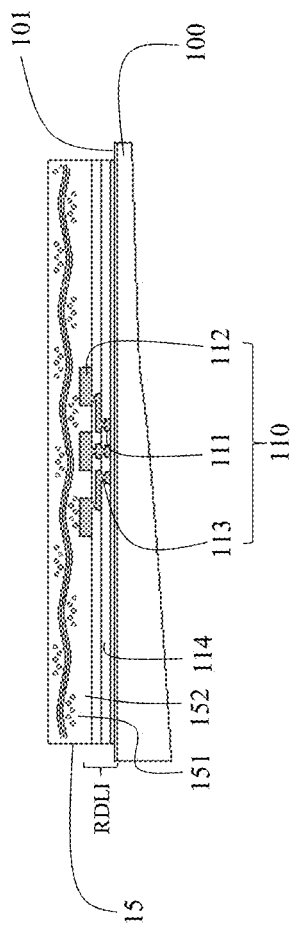

FIG. 2C shows: the glass fiber layer 15 is laminated on the top side of the first redistribution circuitry 110. The plurality of first top metal pads 112 of the first redistribution circuitry 110 is embedded in the third dielectric layer 152 of the glass fiber layer 15.

Figure 2D:
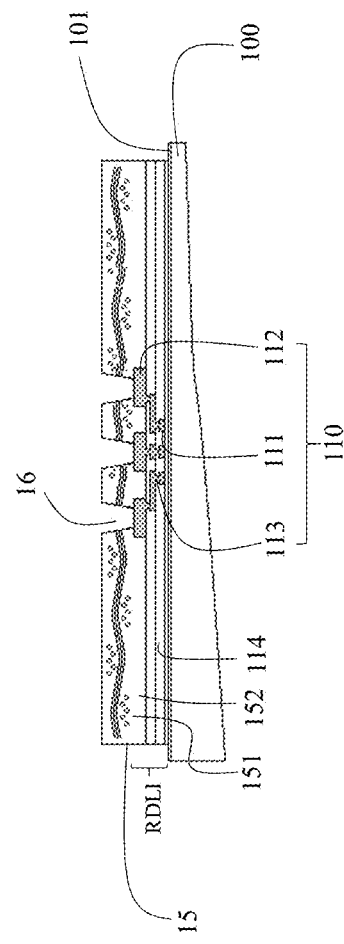

FIG. 2D shows: forming a plurality of via openings 16 from a top side of the glass fiber layer 15. A laser drill can be used to form the via openings 16. Since uneven distribution for the glass fibers 151 exists on a top side with regard to each first top metal pad 112, a higher dosage of laser strength is applied to ensure the via openings 16 being able to fully pass through the glass fibers 151 and to expose a top surface of each corresponding first top metal pad 112.

The plurality of first top metal pads 112 has a thickness which is enough to resist the possible overdosed laser strength from being damaged by the laser during laser drill. Therefore, the thickness for the first top metal pads 112 is configured thicker, may be 5~7 um, for example. The thickness for the other metal layer or layers 111 below the first top metal pads 112 within the first redistribution circuitry 110 may be 2~4 um, for example.

Figure 2E:
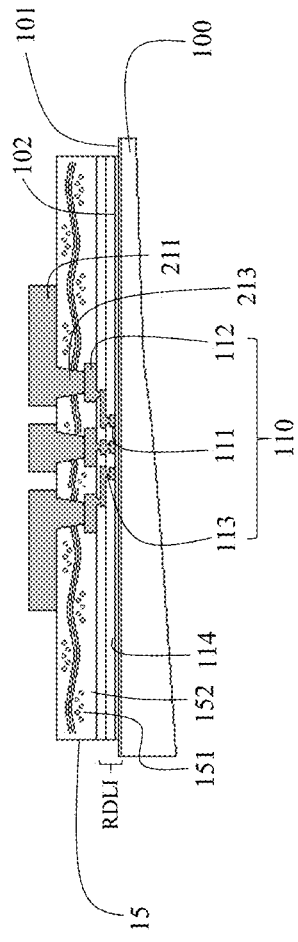

FIG. 2E: forming a second redistribution circuitry 210 on a top side of the glass fiber layer 15.

A plurality of second bottom metal pads 211 with a plurality of second metal vias 213 are made on a top side of the glass fiber layer 15. Each of the second metal vias 213 is electrically coupled to a top side of a corresponding first top metal pad 112.

Figure 2F:
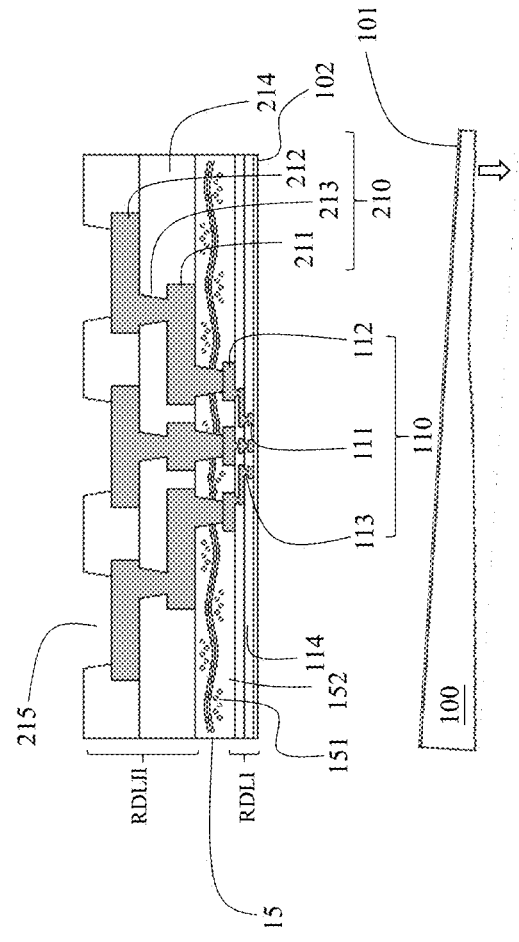

FIG. 2F shows: the second redistribution circuitry 210 comprises a plurality of second bottom metal pads 211 and a plurality of second top metal pads 212. The plurality of second metal vias 213 is electrically coupled between metal layers 211, 212 in thickness direction within the second redistribution circuitry 210. Each circuit 211, 212 of the second redistribution circuitry 210 has a thickness greater than each circuit 111, 112 of the first redistribution circuitry 110.

The first redistribution circuitry 110 is configured according to a first design rule, for example, an integrated circuit (IC) design rule; and the second redistribution circuitry 210 is configured according to a second design rule, for example, a printed circuit board (PCB) design rule.

The first redistribution layer RDLI comprises the first redistribution circuitry 110 and the first dielectric layer 114 which embeds the first redistribution circuitry 110. The second redistribution layer RDLII comprises the second redistribution circuitry 210 and the second dielectric layer 214 which embeds the second redistribution circuitry 210.

Each metal via 113, 213 has a shape of top wide and bottom narrow in a section view. A thickness for the first top metal pads 112 is made between the first thickness and the second thickness.

The temporary carrier 100 is removed from bottom side of the package substrate.

Figure 2G:
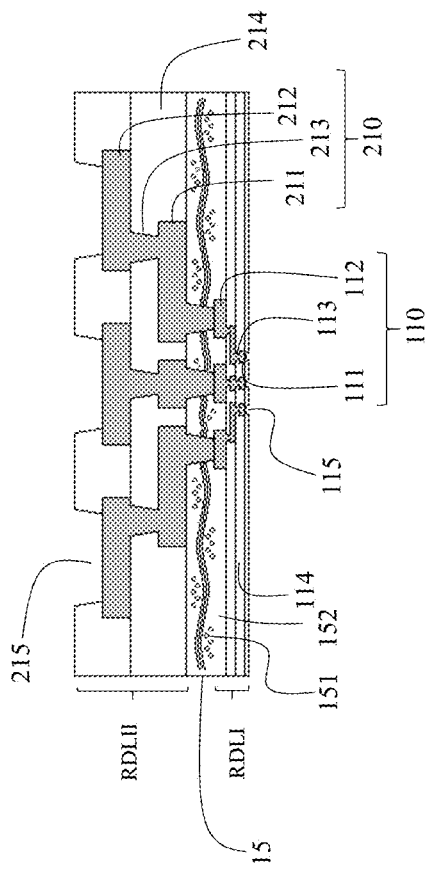

FIG. 2G shows: A plurality of first opening 115 are formed on a bottom side of the first dielectric layer 114, each first opening 115 exposes a bottom surface of a corresponding first bottom metal pad 111.

A plurality of second opening 215 are formed on a top side of the second dielectric layer 214, each second opening 215 exposes a top surface of a corresponding second top metal pad 212.

Figure 2H:
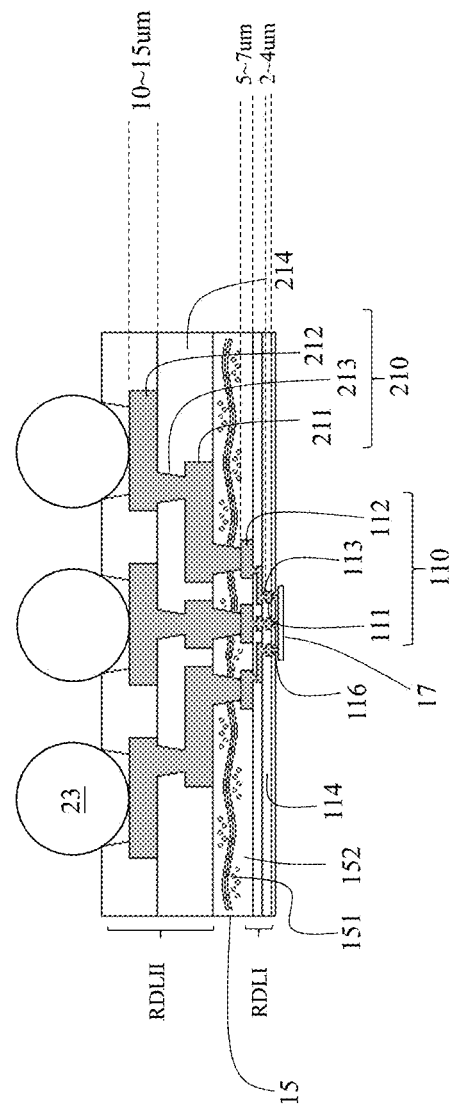

FIG. 2H shows: at least a chip 17 is configured on a bottom side of the first redistribution circuitry 110. A plurality of metal pillars 116 configured on a top side of the chip 17. Each metal pillar 116 is electrically coupled to a bottom side of a corresponding first bottom metal pads 111 of the first redistribution circuitry 110.

A plurality of solder ball 23 is configured on a top side of the second redistribution circuitry 210. Each solder ball 23 is configured on a top surface of a corresponding second top metal pad 212.

While several embodiments have been described by way of example, it will be apparent to those skilled in the art that various modifications may be configured without departs from the spirit of the present invention. Such modifications are all within the scope of the present invention, as defined by the appended claims.

NUMERICAL SYSTEM 100 temporary carrier
101 release layer
110 first redistribution circuitry
111 first bottom metal pads
112 first top metal pads
113 first metal vias
114 first dielectric layer
115 first opening
116 metal pillars
117 chip
15 glass fiber layer
151 glass fiber
152 third dielectric layer
16 via opening
210 second redistribution circuitry
211 second bottom metal pads
212 second top metal pads
213 second metal vias
214 second dielectric layer
215 second opening
RDLI first redistribution layer
RDLII second redistribution layer

What is claimed is:

1. A glass fiber reinforced package substrate, comprising:
   a first redistribution circuitry having a plurality of metal layers;
   a topmost metal layer of the first redistribution circuitry comprising a plurality of metal pads;
   a second redistribution circuitry configured on a top side of the first redistribution circuitry, having a plurality of metal layers; a bottommost metal layer of the second redistribution circuitry comprising a plurality of metal vias;
   each metal via on the bottommost metal layer of the second redistribution circuitry electrically coupled to a top surface of a corresponding metal pad of the topmost metal layer in the first redistribution circuitry;
   a glass fiber layer configured between the first redistribution circuitry and the second redistribution circuitry; and
   the plurality of metal pads on the topmost metal layer of the first redistribution circuitry and the plurality of metal vias on the bottommost metal layer of the second redistribution circuitry embedded in the glass fiber layer,
   wherein the first redistribution circuitry is embedded in a first dielectric layer, the second redistribution circuitry is embedded in a second dielectric layer, a plurality of glass fibers is embedded in a third dielectric layer, and the third dielectric layer is disposed between the first dielectric layer and the second dielectric layer.

2. The glass fiber reinforced package substrate as claimed in claim 1, wherein the plurality of metal pads on the topmost metal layer in the first redistribution circuitry has a thickness greater than a thickness of the metal layers below the topmost metal layer in the first redistribution circuitry.

3. The glass fiber reinforced package substrate as claimed in claim 1, wherein each metal layer of the second redistribution circuitry has a thickness greater than a thickness of each metal layer of the first redistribution circuitry.

4. The glass fiber reinforced package substrate as claimed in claim 1, wherein each metal via in the bottommost metal layer of the second redistribution circuitry is electrically coupled to a top side of a corresponding metal pad on the topmost metal layer in the first redistribution circuitry.

5. The glass fiber reinforced package substrate as claimed in claim 1, wherein the first redistribution circuitry is configured according to a first design rule, the second redistribution circuitry is configured according to a second design rule.

6. The glass fiber reinforced package substrate as claimed in claim 5, wherein the first design rule is IC design rule and the second design rule is PCB design rule.

7. The glass fiber reinforced package substrate as claimed in claim 1, further comprises:
   a plurality of bottom openings configured on a bottom side of the first dielectric layer; each bottom opening exposes a bottom surface of a corresponding metal pad of a bottommost metal layer in the first redistribution circuitry.

8. The glass fiber reinforced package substrate as claimed in claim 1, further comprises:
   a plurality of top openings configured on a top side of the second dielectric layer; each top opening exposes a top surface of a corresponding metal pad of a topmost metal layer in the second redistribution circuitry.

9. The glass fiber reinforced package substrate as claimed in claim 7, further comprises: at least one chip electrically coupled to the metal pads exposed out of the bottom opening of the first dielectric layer.

10. The glass fiber reinforced package substrate as claimed in claim 7, further comprises: a plurality of solder balls, each solder ball electrically coupled to a top surface of a corresponding metal pad exposed out of a top opening of the second dielectric layer.

* * * * *